United States Patent [19]
Lin et al.

[11] Patent Number: 5,313,432
[45] Date of Patent: May 17, 1994

[54] SEGMENTED, MULTIPLE-DECODER MEMORY ARRAY AND METHOD FOR PROGRAMMING A MEMORY ARRAY

[75] Inventors: Sung-Wei Lin; John F. Schreck; Phat C. Truong, all of Houston; David J. McElroy, Lubbock; Harvey J. Stiegler; Benjamin H. Ashmore, Jr., both of Houston; Manzur Gill, Arcola, all of Tex.

[73] Assignee: Texas Instruments Incorporated, Dallas, Tex.

[21] Appl. No.: 790,122

[22] Filed: Nov. 12, 1991

Related U.S. Application Data

[63] Continuation of Ser. No. 518,394, May 23, 1990, abandoned.

[51] Int. Cl.$^5$ ............... G11C 16/06; G11C 16/04
[52] U.S. Cl. ............... 365/230.06; 365/185; 365/189.09
[58] Field of Search ........... 365/104, 185, 189.01, 365/189.09, 226, 230.06

[56] References Cited

U.S. PATENT DOCUMENTS

| | | | |
|---|---|---|---|
| 4,063,224 | 12/1977 | Kirschner | 365/189.09 |
| 4,377,857 | 3/1983 | Tickle | 365/185 |
| 4,425,632 | 1/1984 | Iwahashi et al. | 365/185 |
| 4,451,905 | 5/1984 | Moyer | 365/185 |
| 4,639,893 | 1/1987 | Eitan | 365/185 |
| 4,698,787 | 10/1987 | Mukherjee et al. | 365/104 |
| 4,797,857 | 1/1989 | Schreck et al. | 365/226 |
| 4,924,437 | 5/1990 | Paterson et al. | 365/218 |
| 4,949,309 | 8/1990 | Rao | 365/218 |
| 4,954,993 | 9/1990 | Yamaguchi et al. | 365/226 |
| 5,007,025 | 4/1991 | Hwang et al. | 365/226 |
| 5,047,981 | 9/1991 | Gill et al. | 365/218 |

FOREIGN PATENT DOCUMENTS

| | | | |
|---|---|---|---|
| 0134390 | 10/1981 | Japan | 365/238.5 |
| 0308797 | 12/1988 | Japan | 365/230.06 |

*Primary Examiner*—Glenn Gossage
*Attorney, Agent, or Firm*—Theodore D. Lindgren; Leo N. Heiting; Richard L. Donaldson

[57] ABSTRACT

A wordline-decode system of a nonvolatile memory array is split into three smaller decoding subsystems (a Read-Mode Decode Subsystem, a Program/Erase-Mode Decode Subsystem and a Segment-Select Decoder Subsystem). The segmented array has small bit-line capacitance and requires few input connections to each decoding subsystem. The Read-Mode Decoder circuitry and the Program/Erase-Mode Decoder circuitry are separated, allowing the Read-Mode Decoder circuitry to be desired for high speed access and allowing the Program/Erase-Mode Decoder circuitry to be desired for high voltage operation. Buried-bitline segment-select transistors reduce the area required for those transistors. Erasing may be performed after first checking each row of a segment to determine the present of any over-erased cells. Programming may be performed by allowing the common source-column lines of the selected segment to float and by placing preselected voltages on the appropriate wordline and drain-column line.

30 Claims, 4 Drawing Sheets

SEGMENTED, MULTIPLE-DECODER MEMORY ARRAY AND METHOD FOR PROGRAMMING A MEMORY ARRAY

This application a continuation of application Ser. No. 07/518,394, filed May 23, 1990, now abandoned.

BACKGROUND OF THE INVENTION

This invention relates to segmentation of memory arrays and, in particular, to segmentation of nonvolatile memory arrays such as electrically-erasable, electrically-programmable, read-only-memories (EEPROMs). In particular, this invention relates to a segmented array architecture having buried-bitline, segment-select transistors, having remote wordline decoders, and having segment decoders.

The speed of access to information contained in nonvolatile memory arrays is largely dependent on the capacitance of the bitlines and the wordlines. Those capacitances are a function of choices that include the lengths of the bitlines and wordlines, pitch, chip/bar size and aspect ratio, and process parameters. In general, small capacitances are required for fast access time during operation of memory arrays. Conventional segmentation with separate driver circuitry for each segmented wordline and for each segmented bitline is generally impermissible because that method of reducing the access time delay requires an unacceptable increase in driver circuit area on integrated circuit chips.

Increased component density in memory arrays has led to higher bitline capacitance. One way of decreasing that capacitance has been to segment the bitlines of arrays. Segmentation of bitlines of a memory array is described in U.S. patent application Ser. No. 07/402,402, filed Sep. 5, 1989 (issued Jun. 11, 1991 as U.S. Pat. No. 5,023,837) and also assigned to Texas Instruments Incorporated.

In high-density, flash-erase-type EEPROMs, reduced wordline pitch and an increased number of voltages applied to the wordlines have created difficulty in laying out the rather complicated wordline decoder and other control circuits efficiently. A need has arisen for a segmented array that allows a fewer number of wordline decoders, which are remotely located from the wordlines and which have a more-sophisticated design.

SUMMARY OF THE INVENTION

This invention describes an alternative to the array segmentation described in the aforementioned U.S. patent application Ser. No. 07/402,402, filed Sep. 5, 1989 (issued Jun. 11, 1991 as U.S. Pat. No. 5,023,387) and also assigned to Texas Instruments Incorporated. That application describes segmentation of bitlines for connection to bitline decoding circuitry while, at the same time, combining wordlines of the various segments for connection to wordline decoding circuitry. The segmentation and decoding connection described in that application permits faster speed of operation with minimal or no area penalty. The area penalty is avoided by driving common wordlines in each of the segments, effectively increasing the wordline pitch at the wordline decoder, while at the same time decreasing the number of wordline decoders required.

In this invention, the wordline decode system of the entire array is split into three smaller decoding subsystems (a Read-Mode Wordline Decode Subsystem, a Program/Erase-Mode Decode Subsystem and a Segment-Select Decode Subsystem). Fewer inputs are connected to each decoding subsystem. Because the Read-Mode Decoder circuitry and the Program/Erase-Mode Decoder circuitry are separated, the Read-Mode Decoder circuitry may be made optimum for high speed access and the Program/Erase-Mode Decoder circuitry may be made optimum for high voltage operation. Buried-bitline segment-select transistors reduce the area required for those transistors, as compared to the area required in known prior-art decoder systems.

The invention includes methods for erasing and for programming segmented arrays of such cells.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1A:
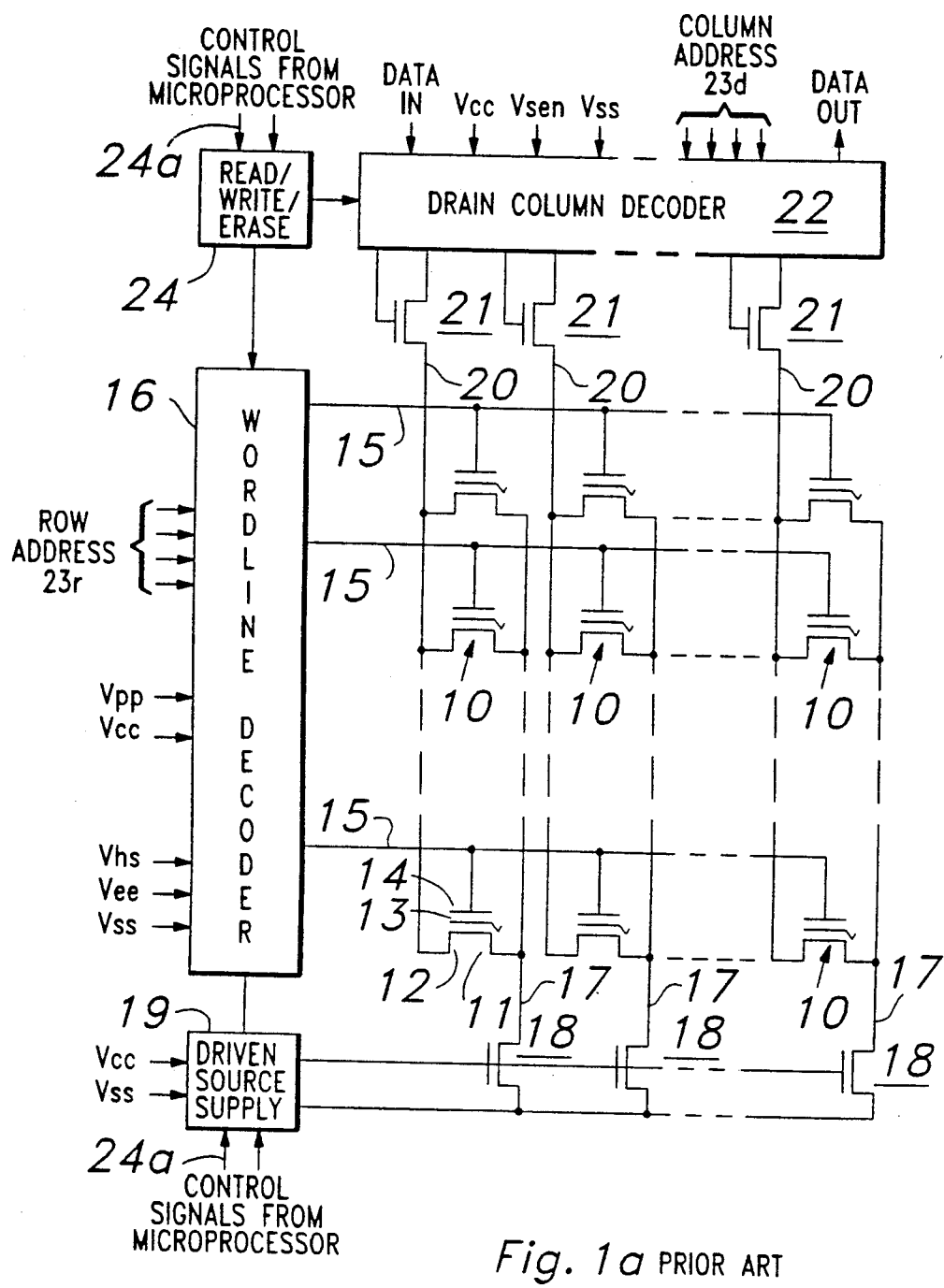
FIG. 1a illustrates a schematic diagram, in partial block form, of a prior-art, nonvolatile memory array.

Referring to FIG. 1a, a nonvolatile array of memory cells, which is an integral part of a memory chip, is shown. Each cell is a floating-gate transistor 10 including a first electrode 11 (source), a second electrode 12 (drain), a floating-gate conductor 13 and a control electrode 14 (control gate). A cross-sectional view of a typical prior-art floating-gate transistor 10 is illustrated in FIG. 1a as formed on a substrate SUB. Each of the control gate electrodes 14 in a row of cells is connected to a wordline 15, and each of the plurality of wordlines 15 is connected to a wordline decoder 16. Each of the source electrodes 11 in a column of cells is connected to one of a plurality of source-column lines 17, and each of the source-column lines 17 is connected through a first logic switch 18 to a driven source supply 19. Each of the drain electrodes 12 in a column of cells is connected to one of a plurality of drain-column lines 20, and each of the drain-column lines 20 is connected through a second logic switch 21 to a drain-column decoder 22.

In a write or program mode of operation, the wordline decoder 16 may function, in response to wordline-address signals on lines 23r, to place a preselected first programming voltage Vpp (approx. +18V) on a selected wordline 15, including the control-gate conductor 14 of the selected cell 10. Drain-column decoder 22 functions, in response to bitline-address signals on lines 23d, to place a preselected second programming voltage (reference potential Vss or ground) on drain-column lines 20, which includes the drain region 12 of the selected cell 10. The wordline decoder 16 may, optionally and in response to wordline-address signals on lines 23r, place a third preselected voltage Vhs (approx. +7V) on deselected wordlines 15, including control-gate conductors 14 of deselected cells 10. The third preselected, or "half-select" voltage Vhs, should be sufficiently close to the second programming voltage that the floating-gate conductors 13 associated with the deselected wordlines 15 will not be programmed as a result, but should be sufficiently high that stress will be reduced across any tunnelling windows TW of cells in deselected wordlines 15, thereby avoiding de-programming of pre-programmed cells. Drain column decoder 22 also functions to place a fourth preselected voltage, which may also be Vhs, on deselected drain-column lines 20. All source-column lines 17 are allowed to float by driven source supply 19. The positive voltage Vpp applied to the control gate 14 of the selected cell 10 causes the semi-conductive source-drain path of the selected cell 10 to be conductive. Therefore, the source 11 of the selected cell 10 is at the same potential (Vss) as the drain 12 of that cell 10. The preselected second programming voltage Vss must differ sufficiently from the first preselected programming voltage Vpp that excess electrons will migrate, perhaps by Fowler-Nordheim tunneling, to the floating-gate conductor 13 of the selected cell 10 and, as a result, program that selected floating-gate conductor 13. The third and fourth preselected Voltage (Vhs) should be placed on the deselected wordlines 15 and deselected drain-column lines 20 prior to placing both the first and second preselected voltages Vpp and Vss on their respective electrodes. The first programming voltage may be placed on the control-gate conductors 14 in a gradual manner so as to reduce voltage-induced stress on the selected cell 10. The floating gate 13 of the selected cell 10 will be charged with electrons, and the electrons in turn render the source-drain current path under the floating gate 13 of the cell 10 nonconductive, a state which is read as a "zero" bit. Non-programmed cells have source-drain current paths under the floating gate 13 that remain conductive, and those cells are read as "one" bits.

During a flash-erase mode of operation, the driven source supply 19 functions to apply a positive voltage Vcc (approx. +5V) to all the source-column lines 17. The drain-column decoder 22 functions to leave all drain-column lines 20 floating. The wordline decoder 16 functions to apply a high negative voltage Vee (approx. −11V) to all the wordlines 15. The excess electrons are removed from the floating gates 13 of programmed cells, perhaps by Fowler-Nordheim tunneling.

In the read mode of operation, the wordline decoder 16 functions, in response to wordline-address signals on lines 23r, to apply a preselected positive voltage Vcc (approx. +5V) to the selected wordline 15, and to apply a low voltage (ground or Vss) to deselected wordlines 15. The drain-column decoder 22 functions, in response to drain-column-address signals on lines 23d, to apply a preselected positive voltage Vsen (approx. +1.5V) to the selected drain-column line 20. The driven source supply 19 functions to connect all source-column lines 17 to ground (or Vss). The conductive or nonconductive state of the cell connected to the selected drain-column line 20 and the selected wordline 15 is detected by a sense amplifier (not shown) connected to the DATA OUT terminal.

The mode of operation is controlled by Read-/Write/Erase circuit 24, which in response to CONTROL SIGNALS 24a input from a microprocessor, not shown furnishes appropriate signals to wordline decoder 16, drain-column decoder 22 and driven source supply 19.

Figure 1B:
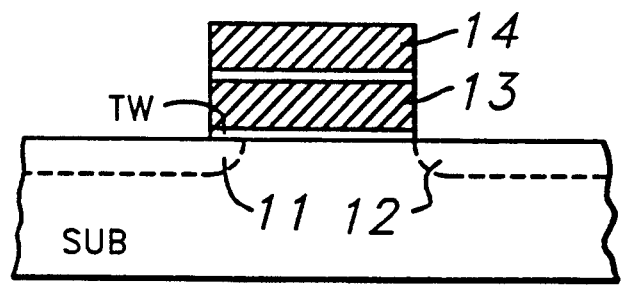
FIG. 1b illustrates a cross-sectional view of a typical prior-art memory cell formed on a substrate.

As is well-known, the source regions 11 and drain regions 12 of memory cells 10 may be interchanged for the various modes of operation. For example, the Fowler-Nordheim tunneling may take place between a drain region 12 and floating-gate conductor 13 rather than between source region 11 and floating-gate conductor 13, as shown in FIG. 1. Therefore, the terms "source" and "drain" as used herein are considered interchangeable for each mode of operation.

For convenience, a table of read, write and erase voltages s given in the TABLE I below:

TABLE I

|  | Read | Program | Flash Erase |
| --- | --- | --- | --- |
| Selected Wordline | 5 V | 18 V | −11 V (All) |
| Deselected Wordlines | 0 V | 7 V |  |
| Source-Column Lines | 0 V | Float | 5 V |
| Selected Drain Column | 1.5 V | 0 V | Float (All) |
| Deselected Drain Column | 0 V | 7 V |  |

A typical large array of the type illustrated in FIG. 1 may have perhaps thousands of rows and columns of memory cells 10.

Each wordline 15 of the circuit of FIG. 1 is separately connected to an output of wordline-decode circuit 16. The circuit elements of wordline-decode circuit 16 may be distributed throughout the array to minimize the chip area required for conductors.

Figure 2:
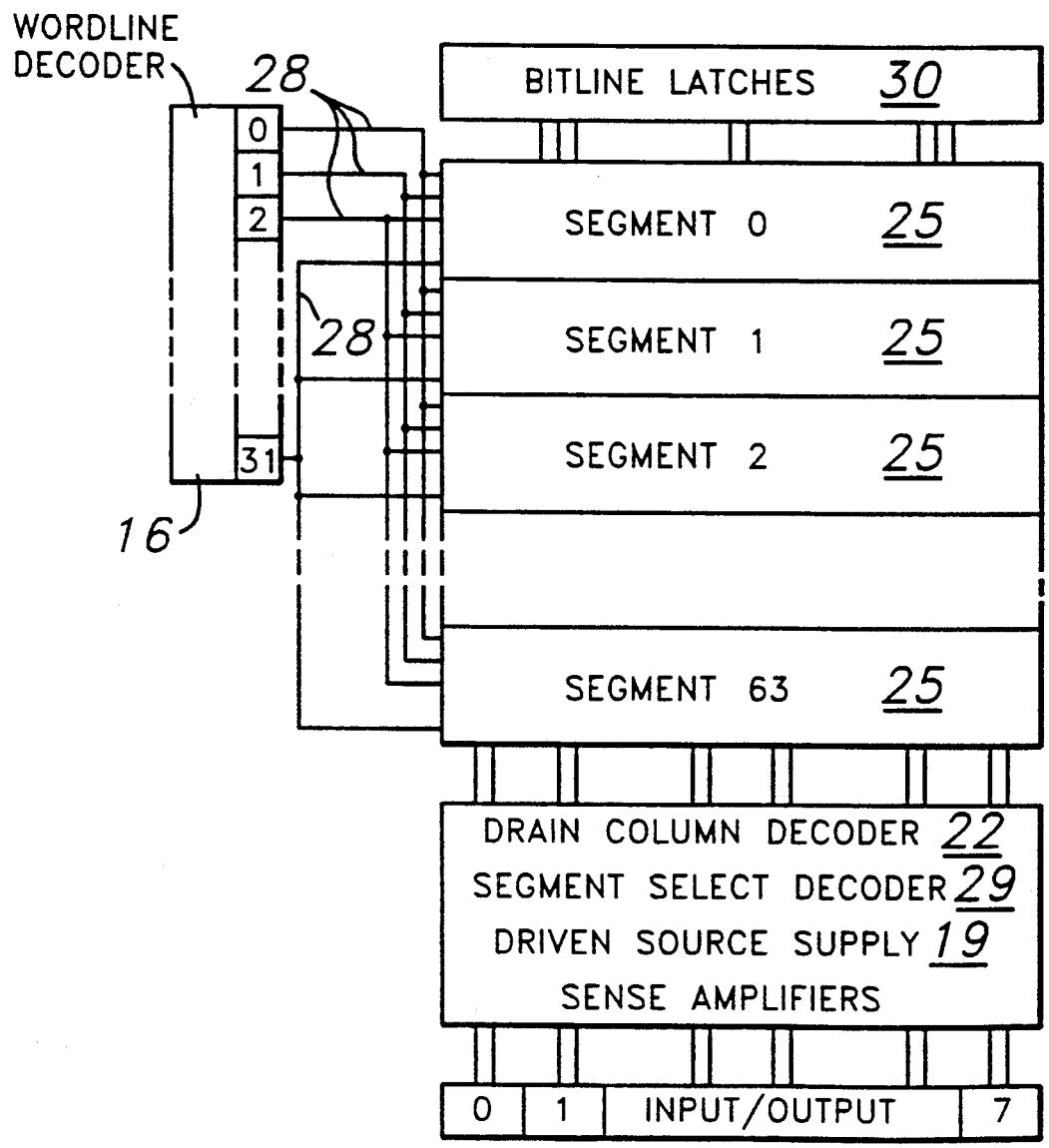
FIG. 2 illustrates a schematic diagram, in block form, of electrical connections for the logical organization of a nonvolatile memory array constructed in accordance with an embodiment of this invention.
Figure 3:
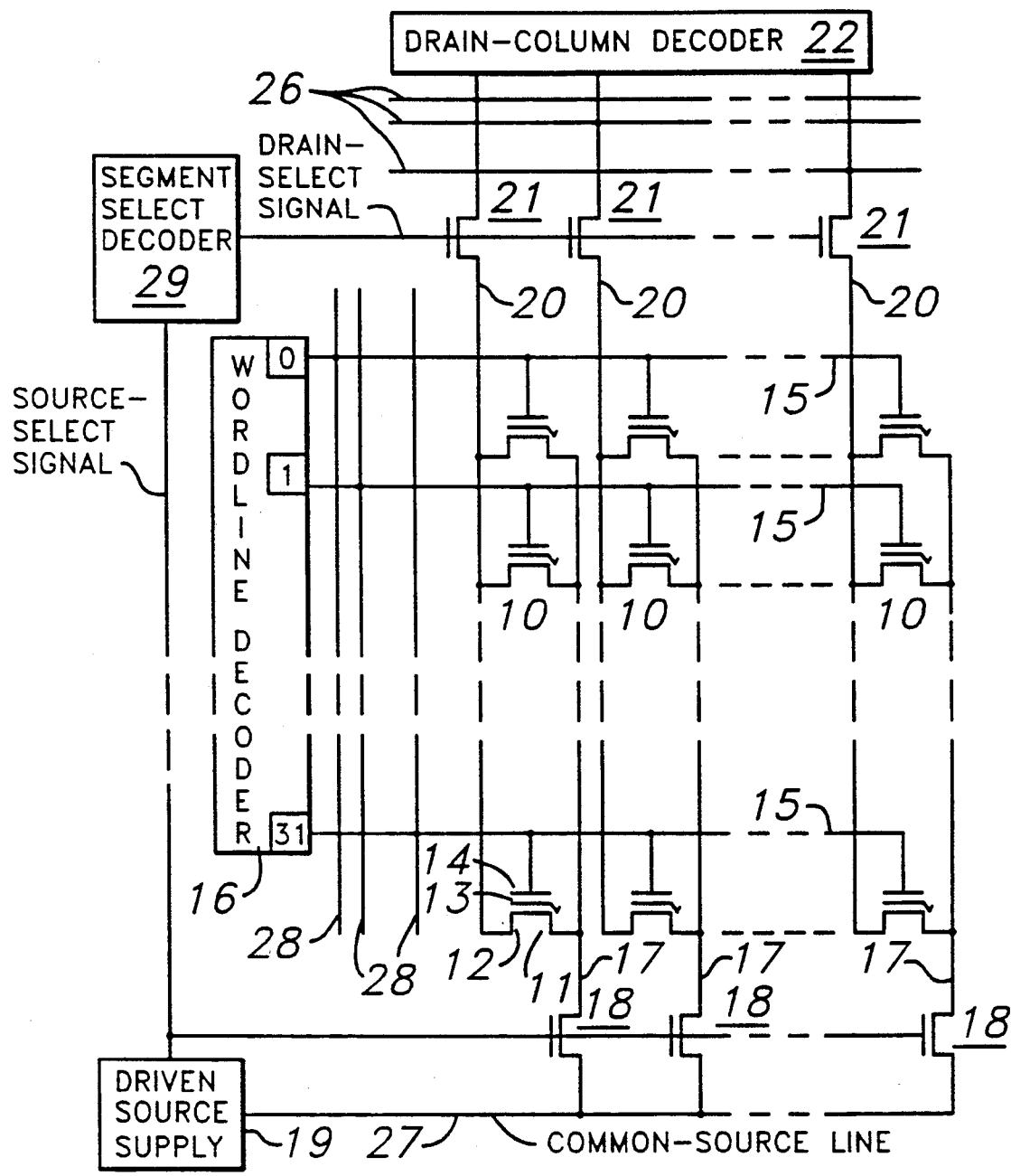
FIG. 3 illustrates a schematic diagram, in partial block form, of the arrangement-of nonvolatile memory cells within a segment of the diagram of FIG. 2.

Referring to FIGS. 2 and 3, the nonvolatile memory array of FIG. 1 is segmented into a plurality of rows and columns of memory-cell segments 25. Each drain-column line 20 (bitline) of each segment 25 is connected through a second logic switch 21, which is illustrated as a segment-select transistor, to external bitline 26. External bitline 26 may be globally connected to common drain-column lines 20 of other segments 25. Each source-column line 17 is connected through a first logic switch 18, which is illustrated as a field-effect transistor, to a driven common-source line 27. Each wordline 15 may be parallel-connected to a common external wordline 28. The control electrodes, or gate terminals, of the second logic switches 21 in each segment are connected to a drain-select signal terminal of segment-select decoder 29. The control terminals, or gates, of first logic switches 18 are commonly connected to a source-select signal terminal of segment-select decoder 29.

For example, a nonvolatile memory array may be constructed with sixty-four segments 25, each comprising thirty-two wordlines 15 as indicated in FIG. 2. The corresponding wordlines 15 from each segment 25 may be connected in parallel and driven by a set of thirty-two wordline decoders 16, which provide separate high negative voltage generators for the erase mode of operation. Each wordline 15, or set of connected wordlines 15, can be independently erased in a single erase cycle, or, alternatively, the entire chip may be erased in one cycle. The device may be programmed one byte at a time, or up to a full page (one wordline 15 of one segment 25) may be programmed in a single cycle using a bank of bitline latches 30 to provide the necessary data storage for page programming. Using the page mode, bitline latches 30 are set one at a time by input signals transmitted by drain column decoder 22 through drain-column lines 20. The data stored in bitline latches 30 are then programmed simultaneously into cells 10 in a row of a segment 25.

Referring specifically to FIGS. 1a and 3, each cell 10 of a segment 25 may be formed between a local drain-column line 20 and local source-column line 17. The drain-column lines 20 and the source-column lines 17 may be N+ diffusions that are buried in a semiconductor substrate of P+ type conductivity. First and second segment-select transistors 18 and 21 may be N-channel field-effect transistors having sources and drains formed with the buried N+diffusions of the memory cells 10, allowing a compact layout for each segment. Because each segmented drain-column line 20 is relatively short, the drain-column line 20 capacitance is reduced and the speed of performance improved.

During the read mode of operation, a voltage (perhaps equal to the supply voltage Vcc) may be applied to the selected wordline 15 and the deselected wordlines 15 may be at ground. All of the sources 11 in all of the segments 25 are driven to ground (Vss). The selected drain-column line 20 receives the necessary bias (Vsen) from the sense amplifier.

During the programming mode of operation, an internally generated voltage of approximately eighteen volts (Vpp) is applied to the selected wordline 15, while an intermediate "half-select" potential (Vhs) is applied to the deselected wordlines 15. The source switches 18 of the selected segment 25 are off or non-conductive, separating the source-column lines 17 from the driven source supply 19. The source switches 18 of the deselected segments 25 are on, connecting the source-column lines to potential Vhs. The drain 12 of the cell 10 to be programmed is driven to ground (Vss), and the corresponding source 11 will follow by conduction. The drains 12 of deselected cells 10 default to potential Vhs.

During the erase mode of operation, a negative potential of approximately −11 volts (Vee) is applied to the selected wordline 15, or to all of the wordlines 15 for flash (or full-chip) erase. In a sector erase mode, potential Vcc is applied to the deselected wordlines 15. A sector erase mode may be used to erase one row of cells 10 in a segment 25 or may be used to erase a row of cells 10 in several segments where those rows have commonly connected wordlines 15. All of the sources 11 are driven to potential Vcc during the erase mode of operation and all of the drains 12 are allowed to float. Segments 25 may be erased one row of memory cells 10 at a time. After erasure of a row, the memory cells 10 in that row may be tested to determine whether or not any memory cell 10 of that row is in an over-erased state. A cell 10 that is over-erased has a source-drain path that is conductive with no voltage on the control gate of that cell 10. Each row of cells 10 may be individually inspected for over-erasure because the segment-select decoder 29 isolates cells 10 in different segments connected to commonly connected wordlines and also connected to commonly connected bitlines. If any memory cell 10 is found to be over-erased, the over-erased condition is removed before proceeding with the erasing procedure. One method for removing the over-erased condition is to apply a partial programming voltage to the control electrode 14 of the over-erased cell lo to inject a small number of electrons into the floating gate 13. Another method is to apply alternating, decreasing-magnitude, programming and erasing voltages to the over-erased memory cell 10 to neutralize the charge on the floating gate 13. After removal of the over-erased condition, the next row, or commonly connected rows, of memory cells 10 may then be erased, and the method continued until all of the cells 10 in an array are erased, but not over-erased.

The read, program and erase modes of operation of the array are detailed in Table II below:

TABLE II

| Common Source | Read Vss | Program Vhs | Erase Sector Vcc | Erase Chip Vcc |
|---|---|---|---|---|
| Selected Segment | | | | |
| Drain-Select Signal | ON | ON | OFF (All) | OFF (All) |
| Source-Select Signal | ON | OFF | ON (All) | ON (All) |
| Selected Word-line(s) | Vcc | Vpp | Vee | Vee (All) |
| Deselected Word-lines | Vss | Vhs | Vcc | (None) |
| Selected Drain Line | Vsen | Vss | Float (All) | Float (All) |
| Deselected Drain Lines | Float | Vhs | (None) | (None) |
| Deselected Segments | | | (None) | (None) |
| Drain-Select Signal | OFF | OFF | | |
| Source-Select Signal | ON | ON | | |
| All Drain Lines | Float | Vhs | | |

Figure 4:
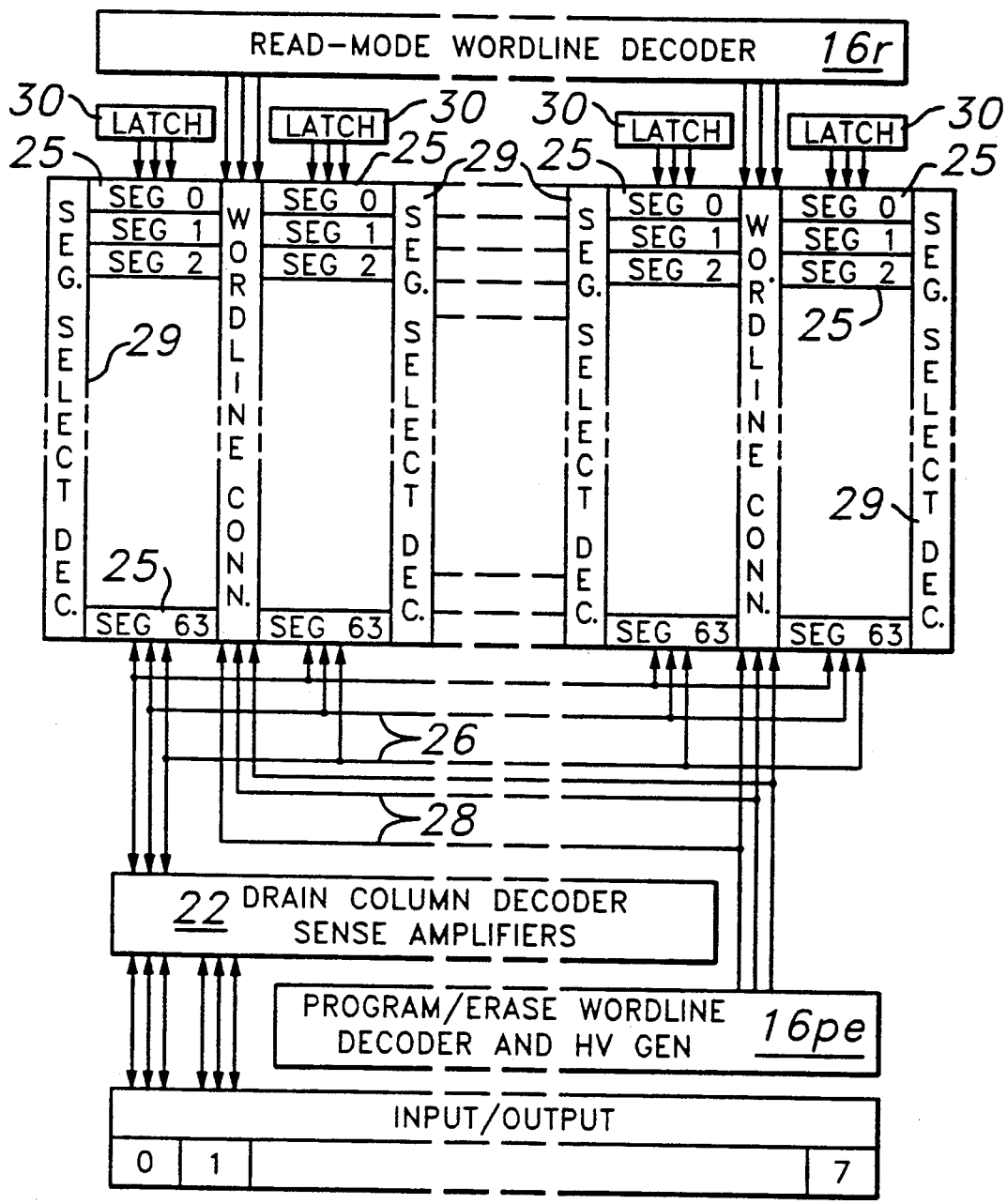
FIG. 4 illustrates a schematic diagram, in block form, of the physical organization of a nonvolatile memory array constructed in accordance with the FIG. 2 embodiment of this invention.

An example of a physical organization of the memory array is illustrated in FIG. 4. The read portion 16r of the remote wordline decoder is located separately at one end (the top) of the columns of segments 25 of the array, while the program/erase portion 16pe is located separately at the other end (the bottom) of the columns of segments 25 of the array. While the read portion 16r of the remote wordline decoder is illustrated as having one set of perhaps 32 output terminals (three are illustrated), portion 16a, may be constructed of a plurality of wordline decoders 16r, each having 32 output terminals and serving a pair of segment columns, the identical wordline decoders 16r operating in parallel. A wordline decoder circuit with separate parts for reading, programming and erasing operations is described in U.S. patent application Ser. No. 07/513,534, filed Apr. 23, 1990, now abandoned in favor of continuation application Ser. No. 07/787,706, filed Nov. 4, 1991 and also assigned to Texas Instruments Incorporated.

Periodic breaks in the array provide for the segment select decoders that are required to enable the selected segment and also provide for routing channels that are required for connecting the wordline decoders 16r and 16pe to the wordlines 15.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A memory array comprising
   a plurality of segments of memory cells, each segment including
   a plurality of memory cells arranged in rows and columns, each memory cell including a control electrode, a first electrode, a second electrode, and a current path between the first and second electrodes;

a plurality of wordlines, control electrodes of memory cells in the same row being connected to a respective one of said wordlines;

a plurality of source-column lines, first electrodes of memory cells in the same column being connected to a corresponding one of said source-column lines;

a plurality of drain-column lines, second electrodes of memory cells in the same column being connected to an associated one of said drain-column lines;

a first wordline decoder circuit for selecting and accessing said wordlines;

a drain-column decoder circuit for selecting and accessing said drain-column lines, said drain-column decoder circuit having a plurality of output terminals;

a driven source supply for supplying electric potentials to said source-column lines, said driven source supply having at least one output terminal;

a segment-select decoder circuit having a drain-select terminal and a source-select terminal;

a first logic switch connected between each source-column line and said at least one output terminal of said driven source supply, each first logic switch having a control electrode, each control electrode of each first logic switch in the same segment being connected to said source-select terminal of said segment-select decoder circuit;

a second logic switch connected between each drain-column line and one of said plurality of output terminals of said drain-column decoder circuit, each second logic switch having a control electrode, each control electrode of each second logic switch in the same segment being connected to said drain-select terminal of said segment-select decoder circuit.

2. The memory array of claim 1, wherein each wordline of each segment is connected to a wordline of at least one other segment.

3. The memory array of claim 1, wherein each drain-column line of each segment is connected to a drain-column line of at least one other segment.

4. The memory array of claim 1, wherein said segments are arranged in columns, and wherein said segment-select decoder circuit is located adjacent one of said columns of segments.

5. The memory array of claim 1, wherein said first wordline decoder circuit selects and accesses said wordlines during reading of said memory cells.

6. The memory array of claim 1, wherein said first wordline decoder circuit selects and accesses said wordlines during reading of said memory cells and wherein said first wordline decoder circuit includes identical subcircuits, each of said subcircuits being connected to at least one of said segments.

7. The memory array of claim 1, wherein said first wordline decider circuit selects and accesses said wordlines during reading of said memory cells and wherein said memory array includes a second wordline decoder circuit that selects and accesses said wordlines during programming of said memory cells.

8. The memory array of claim 1, wherein said first wordline decoder circuit selects and accesses said wordlines during reading of said memory cells, wherein said memory array includes a second wordline decoder circuit that selects and accesses said wordlines during programming of said memory cells, and wherein said first wordline decoder circuit and said second wordline decoder circuit are located separately.

9. The memory array of claim 1, wherein said segments are arranged in columns, wherein said first wordline decoder circuit selects and accesses said wordlines during reading of said memory cells, wherein said memory array includes a second wordline decoder circuit that selects and accesses said wordlines during programming of said memory cells, and wherein said first wordline decoder circuit is located at one end of said columns of segments and wherein said second wordline decoder circuit is located at the other end of said columns of segments.

10. The memory array of claim 1, wherein each first logic switch is a field-effect transistor and each control electrode of each first logic switch is a control-gate terminal of a corresponding field-effect transistor.

11. The memory array of claim 1, wherein each first logic switch is a field-effect transistor located at one end of each source-column line, wherein each source-column line is a buried diffusion, and wherein a source and a drain of each field-effect transistor are buried diffusions incorporated in each source-column-line diffusion.

12. The memory array of claim 1, wherein each second logic switch is a field-effect transistor and wherein each control electrode of each second logic switch is a control-gate terminal of a corresponding field-effect transistor.

13. The memory array of claim 1, wherein each second logic switch is a field-effect transistor located at one end of each drain-column line, wherein each drain-column line is a buried diffusion, and wherein a source and a drain of each field-effect transistor are buried diffusions incorporated in each drain-column-line diffusion.

14. A non-volatile memory array comprising:

a drain-column decoder having a plurality of output terminals;

a driven source supply having at least one output terminal;

a segment-select circuit having a source-select signal terminal and having a drain-select signal terminal;

a first wordline-decoder circuit having a plurality of output terminals;

a plurality of rows and columns of segments, each segment including:

a plurality of memory cells arranged in rows and columns, each memory cell including a control electrode, a first electrode, a second electrode, and a current path between said first and second electrodes;

a plurality of wordlines, each wordline connected to control electrodes of memory cells in a respective row of memory cells and each wordline connected to a corresponding one of said output terminals of said first wordline decoder circuit;

a plurality of source-column lines and a plurality of drain-column lines, each source-column line connected to the first electrode of each memory cell in an associated column of said memory cells and each drain-column line connected to the second electrode of each memory cell in an associated column of said memory cells;

first logic switches respectively connecting each source-column line to said terminal of said driven source supply, each first logic switch having a control electrode, each control electrode of each first logic switch being connected to said source-selected signal terminal of said segment select circuit; and second logic switches respectively connecting each drain-column line to a corresponding one of said terminals of said drain-column decoder, each second logic switch having a control electrode, each control electrode of each second logic switch being connected to said drain-select signal terminal of said segment select circuit.

15. The memory array of claim 14, wherein each wordline of a segment is connected to a wordline of at least one other segment.

16. The memory array of claim 14, wherein each drain-column line of each segment is connected to a drain-column line of at least one other segment.

17. The memory array of claim 14, wherein said segments are arranged in columns, and wherein said segment-select decoder circuit is located adjacent one of said columns of segment.

18. The memory array of claim 14, wherein said first wordline-decoder circuit selects and accesses said wordlines for reading said memory cells.

19. The memory array of claim 14, wherein said first wordline-decoder circuit selects and accesses said wordlines for reading said memory cells and wherein said first wordline-decoder circuit includes identical subcircuits, each of said subcircuits connected to at least one wordline of one of said segments.

20. The memory array of claim 14, wherein said first wordline-decoder circuit selects and accesses said wordlines for reading said memory cells and wherein said memory array includes a second wordline-decoder circuit that selects and accesses said wordlines for at least one of programming and erasing said memory cells.

21. The memory array of claim 14, wherein said first wordline-decoder circuit selects and accesses said wordlines for reading said memory cells, wherein said memory array includes a second wordline-decoder circuit that selects and accesses said wordlines for at least one of programming and erasing said memory cells, and wherein said first wordline decoder circuit and said second wordline decoder circuit are separated.

22. The memory array of claim 14, wherein said segment ar arranged in columns, wherein said first wordline-decoder circuit selects and accesses said wordlines for reading said memory cells, wherein said memory array includes a second wordline-decoder circuit that functions to select and access said wordlines for programming said memory cells, wherein said first wordline-decoder circuit is located at one end of said columns of segments, and wherein said second wordline-decoder circuit is located at the other end of said columns of segment.

23. The memory array of claim 14, wherein each first logic switch is a field-effect transistor and the control electrode of each first logic switch is a control-gate terminal of a corresponding field-effect transistor.

24. The memory array of claim 14, wherein each first logic switch is a field-effect transistor located at one end of each source-column line, wherein each source-column line is a buried diffusion, and wherein a source and a drain of each field-effect transistor are buried diffusions incorporated in each source-column-line diffusion.

25. The memory array of claim 14, wherein each second logic switch is a field-effect transistor and wherein the control electrode of each second logic switch is a control gate terminal of a corresponding field-effect transistor.

26. The memory array of claim 14, wherein each second logic switch is a field-effect transistor located at one end of each drain-column line, wherein each drain-column line is a buried diffusion, and wherein a source and a drain of each field-effect transistor are buried diffusions incorporated in each drain-column-line diffusion.

27. A method for programming a memory array including segments of nonvolatile memory cells, each segment having source-column lines, wordlines and drain-column lines, said memory cells arranged in rows and columns, each memory cell having a first electrode, a second electrode, a part of a semiconductor substrate between the first and second electrodes, a control electrode, a floating gate conductor insulated from and located between the control electrode and said part of said semiconductor substrate, a tunneling window between the first electrode and the floating gate, each control electrode connected to a wordline of said memory array, each first electrode connected to one of said source-column lines, each second electrode connected to one of said drain-column lines, the method comprising:

placing a first voltage on all of the source-column lines of a non-selected segment;

placing said first voltage on all of the drain-column lines of said non-selected segment;

allowing all of said source-column lines of a selected segment of said memory array to electrically float;

placing a second voltage on a selected wordline of said selected segment; and placing a third voltage on a selected drain-column line of said selected segment;

the difference in voltage between said second voltage and said third voltage being sufficient to cause electrons to migrate across the tunneling window of a memory cell connected to said selected wordline and said selected drain-column line to program that memory cell, said first voltage being intermediate to said second voltage and said third voltage.

28. The method of claim 27, wherein said second voltage is applied to said selected wordline in a gradual manner.

29. The method of claim 27, wherein a voltage intermediate to said second voltage and said third voltage is applied to nonselected wordlines of said memory array.

30. The method of claim 27, wherein said array includes at least one latch circuit connected to one of said drain-column lines, wherein said third voltage is stored in said at lest one latch circuit and wherein more than one memory cell in said selected segment is programmed simultaneously.

* * * * *